US007332935B2

(12) United States Patent
Illegems et al.

(10) Patent No.: US 7,332,935 B2
(45) Date of Patent: Feb. 19, 2008

(54) DRIVER WITH VARIABLE OUTPUT VOLTAGE AND CURRENT

(75) Inventors: Paul F. Illegems, Tucson, AZ (US); Srinivas Pulijala, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 35 days.

(21) Appl. No.: 11/425,585

(22) Filed: Jun. 21, 2006

(65) Prior Publication Data

US 2007/0296463 A1 Dec. 27, 2007

(51) Int. Cl.
*H03K 19/0175* (2006.01)

(52) U.S. Cl. .......................................... 326/83; 326/86

(58) Field of Classification Search ............ 326/82-87
See application file for complete search history.

(56) References Cited

U.S. PATENT DOCUMENTS

| | | | | |
|---|---|---|---|---|
| 5,321,319 | A | 6/1994 | Mahmood | |
| 5,767,699 | A * | 6/1998 | Bosnyak et al. | 326/86 |
| 5,883,531 | A | 3/1999 | Kuo | |
| 6,154,061 | A | 11/2000 | Boezen et al. | |
| 6,356,133 | B2 | 3/2002 | Kamiya | |
| 6,411,125 | B1 | 6/2002 | Rombach | |
| 6,532,506 | B1 | 3/2003 | Dunstan et al. | |
| 6,539,443 | B1 | 3/2003 | Dunstan et al. | |
| 6,590,422 | B1 * | 7/2003 | Dillon | 326/86 |
| 6,847,235 | B2 | 1/2005 | Graves | |
| 6,867,618 | B2 * | 3/2005 | Li et al. | 326/83 |
| 6,958,626 | B2 * | 10/2005 | Terletzki et al. | 326/83 |
| 6,980,034 | B2 | 12/2005 | O'Shaugnessy | |
| 7,227,385 | B2 * | 6/2007 | Roessig et al. | 326/136 |
| 2001/0038311 | A1 | 11/2001 | Maeda et al. | |
| 2003/0193350 | A1 * | 10/2003 | Chow | 326/83 |
| 2004/0049616 | A1 | 3/2004 | Dunstan et al. | |
| 2004/0189354 | A1 | 9/2004 | Yanagihara | |
| 2005/0024090 | A1 * | 2/2005 | Terletzki et al. | 326/87 |

* cited by examiner

*Primary Examiner*—Don Le
(74) *Attorney, Agent, or Firm*—Meyertons Hood Kivlin Kowert & Goetzel, P.C.; Jeffrey C. Hood; Mario J. Lewin

(57) ABSTRACT

A driver circuit with variable output voltage and current. A source input terminal of the driver circuit may receive a source control signal. A voltage control circuit may drive one of the terminals of a first switch to a source voltage. If the source input terminal receives an asserted source control signal, the first switch is turned on and the voltage control circuit drives an output terminal of the driver circuit to the source voltage. A source current mirror may regulate a source current provided to the output terminal of the driver circuit. A sink input terminal of the driver circuit may receive a sink control signal. If the sink input terminal receives an asserted sink control signal, a second switch is turned on and the output terminal is driven to a sink voltage. A sink current mirror may regulate a sink current provided to output terminal of the driver circuit.

21 Claims, 3 Drawing Sheets

DRIVER WITH VARIABLE OUTPUT VOLTAGE AND CURRENT

BACKGROUND OF THE INVENTION

1. Field of the Invention

This invention relates to signal transmission mechanisms and, more particularly, to an output driver architecture.

2. Description of the Related Art

Driver circuits are typically used in integrated circuits and systems for driving a signal line or a bus. For example, a driver circuit may enable bus transactions between a source device and a target device. Some driver circuits have complex designs in order to meet various system specifications. However, these driver circuits may be relatively expensive to build. Other driver circuits may have simple designs but fail to accurately control the output current and output voltage, and may also have slow rise and fall times.

SUMMARY OF THE INVENTION

Various embodiments are disclosed of a driver circuit with variable output voltage and current. The driver circuit may receive a source control signal and a sink control signal. The source control signal may determine when the driver circuit enters a source mode of operation, which drives the output terminal of the driver circuit to a high state. The sink control signal may determine when the driver circuit enters a sink mode of operation, which drives the output terminal to a low state.

In various embodiments, a source input terminal of the driver circuit is connected to a first switch and may receive the source control signal. A voltage control circuit may drive one of the terminals of the first switch to a source voltage. If the source input terminal receives an asserted source control signal, the first switch is turned on and the voltage control circuit drives the output terminal of the driver circuit to the source voltage. A source current mirror may be connected to the first switch and may regulate a source current provided to the output terminal of the driver circuit when the first switch is turned on. A sink input terminal of the driver circuit is connected to a second switch and may receive the sink control signal. If the sink input terminal receives an asserted sink control signal, the second switch is turned on and the output terminal of the driver circuit is driven to a sink voltage. A sink current mirror may be connected to the second switch and may regulate a sink current provided to output terminal of the driver circuit when the second switch is turned on.

In one embodiment, the first and second switches may be configured as transistors, e.g., a first transistor and a second transistor, respectively. In this embodiment, the source input terminal of the driver circuit may be connected to the gate terminal of the first transistor, and the source terminal of the first transistor may be connected to the output terminal of the driver circuit. The voltage control circuit may be connected to the drain terminal of the first transistor. The source current mirror may be connected between the drain terminal of the first transistor and a source current source. The sink input terminal of the driver circuit may be connected to the gate terminal of the second transistor, and the drain terminal of the second transistor may be connected to a sink current source. The sink current mirror may be connected between the output terminal of the driver circuit and the source terminal of the second transistor.

In various embodiments, the driver circuit may include both a source voltage control circuit that implements a control loop to drive the output terminal to a desired source voltage, and a sink voltage control circuit that implements a control loop to drive the output terminal to a desired sink voltage.

Figure 1:
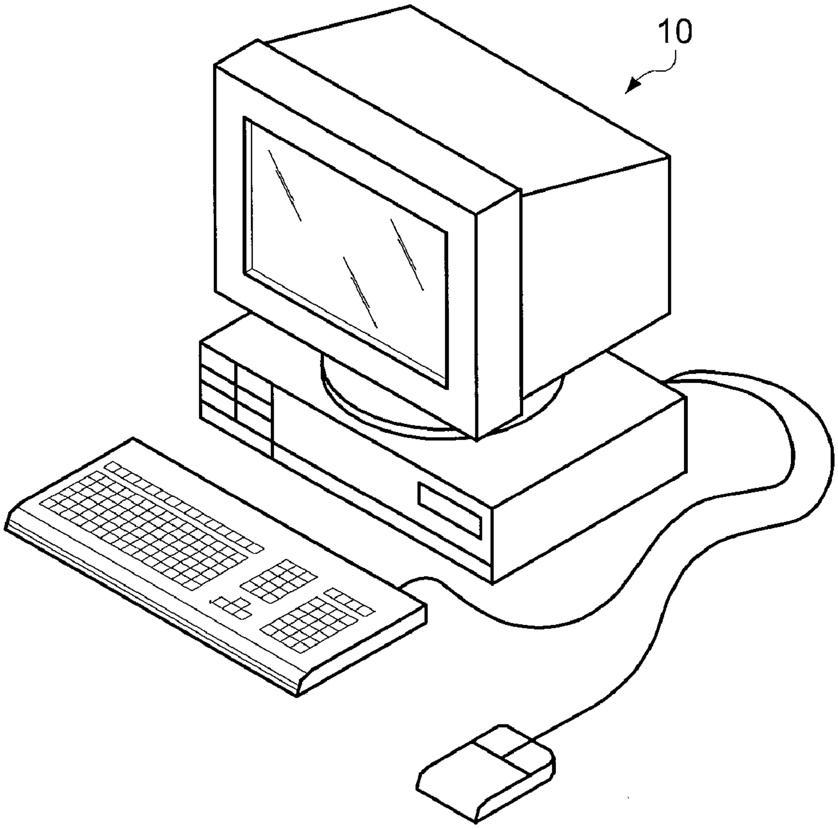
FIG. 1 is a drawing of one embodiment of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

FIG. 1 is a drawing of one embodiment of a computer system 10. In general, the term "computer system" can be broadly defined to encompass any device (or combination of devices) having at least one processor that executes instructions from a memory medium.

Computer system 10 may include at least one processor, which may be any of various types, including an x86 processor, e.g., a Pentium™ class, a PowerPC™ processor, a CPU from the SPARC™ family of RISC processors, as well as others. Also, computer system 10 may include one or more memory subsystems (e.g., Dynamic Random Access Memory (DRAM) devices). The memory subsystems may collectively form the main memory of computer system 10 from which programs primarily execute. The main memory may further store user applications and driver software programs.

Figure 2:
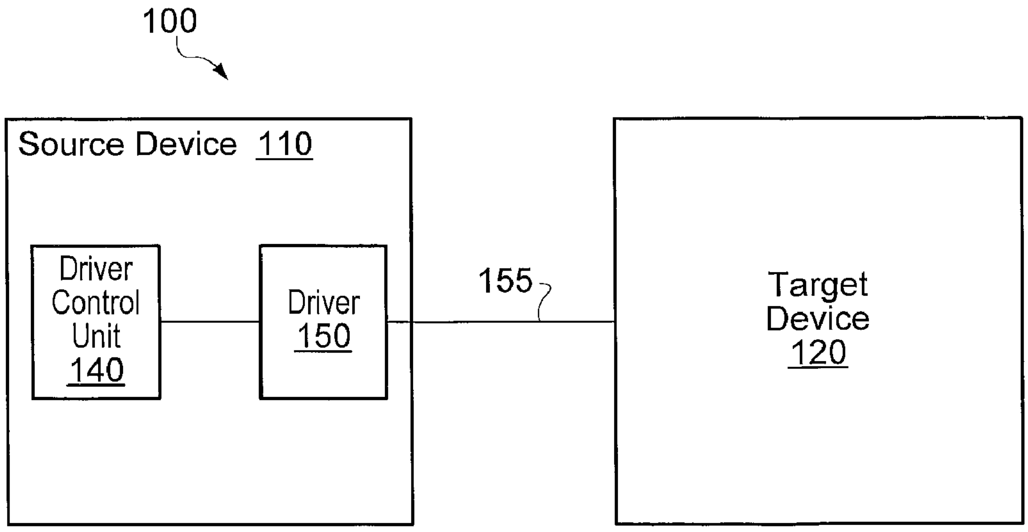
FIG. 2 is a block diagram of one embodiment of a system including a source device having a driver circuit.

FIG. 2 is a block diagram of one embodiment of a system 100. It is noted that in one embodiment, system 100 may be illustrative of a subsection of computer system 10 of FIG. 1. However, it is noted that system 100 may be any electronic system, such as various types of computing or processing systems, including a personal computer system (PC), mainframe computer system, workstation, server blade, network appliance, system-on-a-chip (SoC), Internet appliance, personal digital assistant (PDA), television system, audio systems, grid computing system, or other device or combinations of devices, which in some instances form a network. For instance, in some embodiments, source device 110 and target device 120 may collectively form a network, e.g., a local area network (LAN) or a wireless network.

In one specific implementation, source device 110 may include a driver control unit 140 and a driver circuit 150 for communication with target device 120, as will be described further below with reference to FIG. 3. In some embodiments, communication medium 155 may be a bus. It is noted, however, line 155 may represent other communication means, e.g., a conductive connection between two devices.

Figure 3:
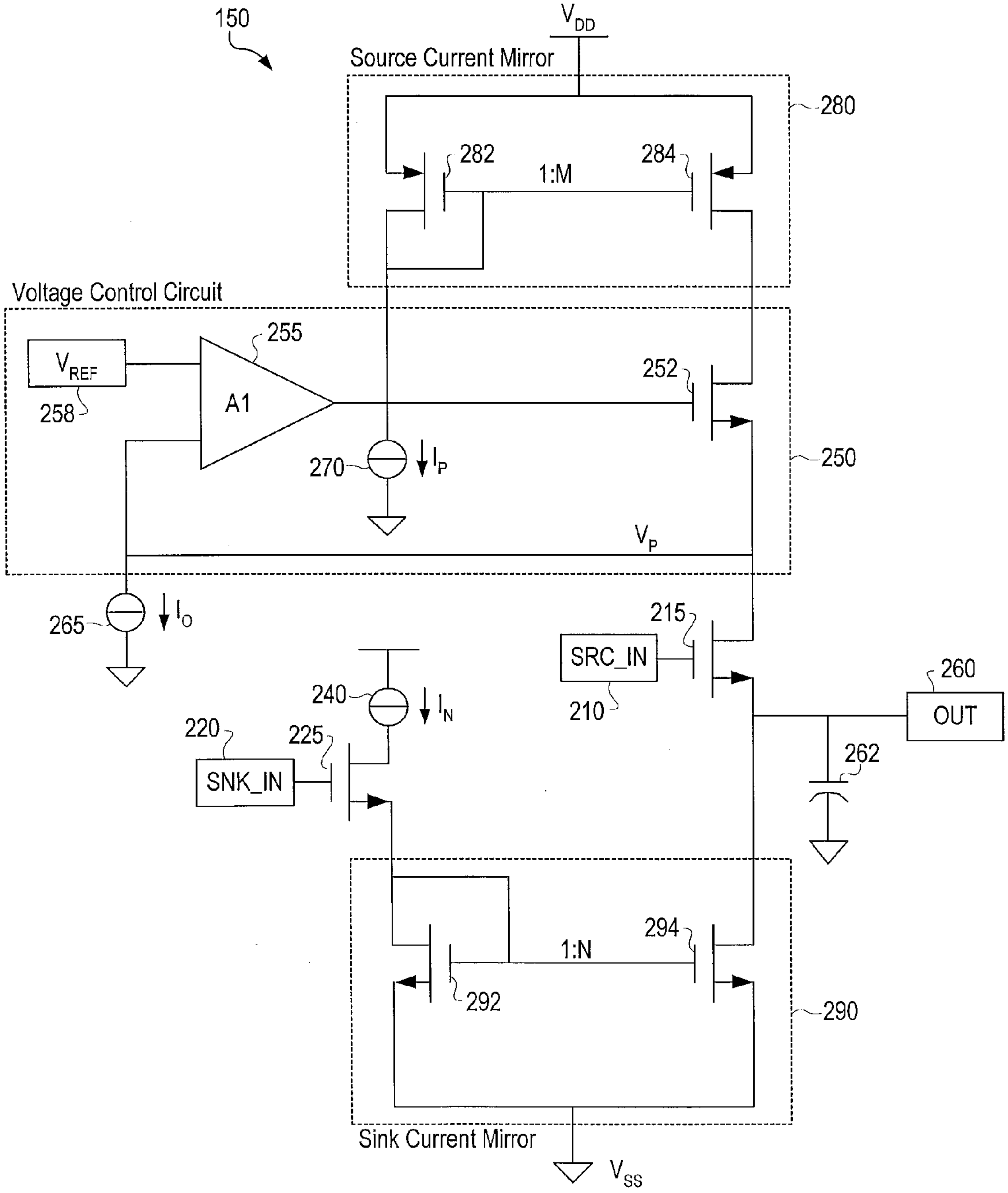
FIG. 3 is a circuit diagram of one embodiment of a driver circuit.

FIG. 3 is a circuit diagram of one embodiment of driver circuit 150. In one specific implementation, driver circuit 150 is formed as illustrated in the embodiment of FIG. 3. In this specific implementation, driver circuit 150 includes a voltage control circuit 250, a source input terminal 210 (SRC_IN), a sink input terminal 220 (SNK_IN), an output terminal 260, an NMOS transistor 215, an NMOS transistor 225, a source current source 270, a sink current source 240, a source current mirror 280, and a sink current mirror 290. Source input terminal 210 is connected to the gate terminal of NMOS transistor 215, and the source terminal of NMOS transistor 215 is connected to output terminal 260. Sink input terminal 220 is connected to the gate terminal of NMOS transistor 225, and the drain terminal of NMOS transistor 225 is connected to sink current source 240. Voltage control circuit 250 is connected to the drain terminal of NMOS transistor 215. Source current mirror 280 is connected between the drain terminal of NMOS transistor 215 and source current source 270. Sink current mirror 290 is connected between output terminal 260 and the source terminal of NMOS transistor 225. Load 262 may represent one or more loads that may be connected to output terminal 260 via communication medium 155, for example, target device 120 of FIG. 2.

In one embodiment, source current mirror 280 includes PMOS transistor 282 and PMOS transistor 284. Sink current mirror 290 includes NMOS transistor 292 and NMOS transistor 294. Voltage control circuit 250 includes an amplifier 255. One of the input terminals of amplifier 255 is connected to a reference voltage source 258 ($V_{REF}$), and the other input terminal is connected to the drain terminals of NMOS transistor 215. The output terminal of amplifier 255 is connected to the gate terminal of an NMOS transistor 252. The drain terminal of NMOS transistor 252 is connected to source current mirror 280, and the source terminal of NMOS transistor 252 is connected to the drain terminal of NMOS transistor 215 and one of the input terminals of amplifier 255.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in some embodiments, driver circuit 150 may include other types of switching mechanisms instead of NMOS transistors 215 and 225, or may include a sink voltage control circuit (e.g., see FIG. 4). Also, in other embodiments, the design of voltage control circuit 250 may vary.

During operation, driver control unit 140 (or other control mechanisms) may provide a source control signal and a sink control signal to driver circuit 150. The source control signal may determine when driver circuit 150 enters a source mode of operation, which drives output terminal 260 (and therefore communication medium 155) to a high state, e.g., to a desired source voltage $V_P$. The sink control signal may determine when driver circuit 150 enters a sink mode of operation, which drives output terminal 260 to a low state, e.g., to a desired sink voltage, such as $V_{SS}$.

As depicted in the embodiment of FIG. 3, voltage control circuit 250 may drive the drain terminal of NMOS transistor 215 to the desired source voltage $V_P$. Source input terminal 210 may receive the source control signal from driver control unit 140. If the received source control signal is asserted, NMOS transistor 215 is turned on and driver circuit 150 enters a source mode of operation. More specifically, in response to turning on NMOS transistor 215, voltage control circuit 250 may drive output terminal 260 of driver circuit 150 to the desired source voltage $V_P$. Additionally, source current mirror 280 may regulate a source current provided to output terminal 260 when NMOS transistor 215 is turned on.

Sink input terminal 220 may receive the sink control signal from driver control unit 140. If the received sink control signal is asserted, NMOS transistor 225 is turned on and driver circuit 150 enters a sink mode of operation. More specifically, in response to turning on NMOS transistor 225, output terminal 260 is driven to a desired sink voltage, e.g., $V_{SS}$, or ground. Furthermore, sink current mirror 290 may regulate a sink current provided to output terminal 260 when NMOS transistor 225 is turned on.

In the illustrated embodiment of FIG. 3, voltage control circuit 250 may implement a control loop to drive the drain terminal of NMOS transistor 215 to the desired source voltage $V_P$. Amplifier 255 of voltage control circuit 250, e.g., an error amplifier, may drive NMOS transistor 252 and keep $V_P$ close to reference voltage $V_{REF}$. In other embodiments, additional circuitry (e.g., a resistor ladder) may be added to voltage control circuit 250 so that $V_P$ is kept at a fraction or a multiple of $V_{REF}$. In one specific implementation, $V_{REF}$ may be 1.5V and $V_P$ may be kept at approximately 1.5V. In this implementation, when NMOS transistor 215 is turned on, output terminal 260 may be maintained at approximately $V_P$=1.5V even while driver 150 is operating at a higher $V_{DD}$, e.g., $V_{DD}$=3.3V. It is noted that in other embodiments voltage control circuit 250 may be designed differently and yet maintain a similar functionality.

The source current delivered to output terminal 260 may be limited to $M \times I_P$ by source current mirror 280. In this way, the maximum source current may be accurately controlled. In particular, the current may be limited when the output is shorted to $V_{SS}$. In one embodiment, driver circuit 150 may also include current source 265, which provides a current $I_O$. Current source 265 may be necessary to bias PMOS transistor 284 and NMOS transistor 252 with a small current, which enables the control loop to maintain its operating point when NMOS transistor 215 is off. Similarly, sink current mirror 290 may limit the sink current delivered to output terminal 260 to $N \times I_N$. In particular, the current may be limited when the output is shorted to $V_{DD}$. In one specific implementation, $M \times I_P$ may equal approximately 7.5 mA, $N \times I_N$ may equal approximately 0.75 mA, and $I_O$ may equal 36 μA. It is noted, however, that the current and voltage values may vary from one implementation to another.

In one embodiment, when both the source control and sink control signals are deasserted by driver control unit 140, NMOS transistor 215 and NMOS transistor 225 are turned off and driver circuit 150 may enter a tristate mode. In other words, driver circuit 150 may enter a high impedance mode. In this case, output terminal 260 may act as an in input, enabling bidirectional functionality.

System 100 may include driver circuit 150 to accurately control the output voltage and current provided to output terminal 260. In various embodiments, the source control signal and the sink control signal may be independent control signals used for controlling the mode of operation of driver circuit 150. In addition, source current mirror 280 and sink current mirror 290 may independently control the source current and the sink current, respectively, provided to output terminal 260 of driver circuit 150. During operation, the design of driver circuit 150 may enable fast rise and fall times when switching from one state to another.

Figure 4:
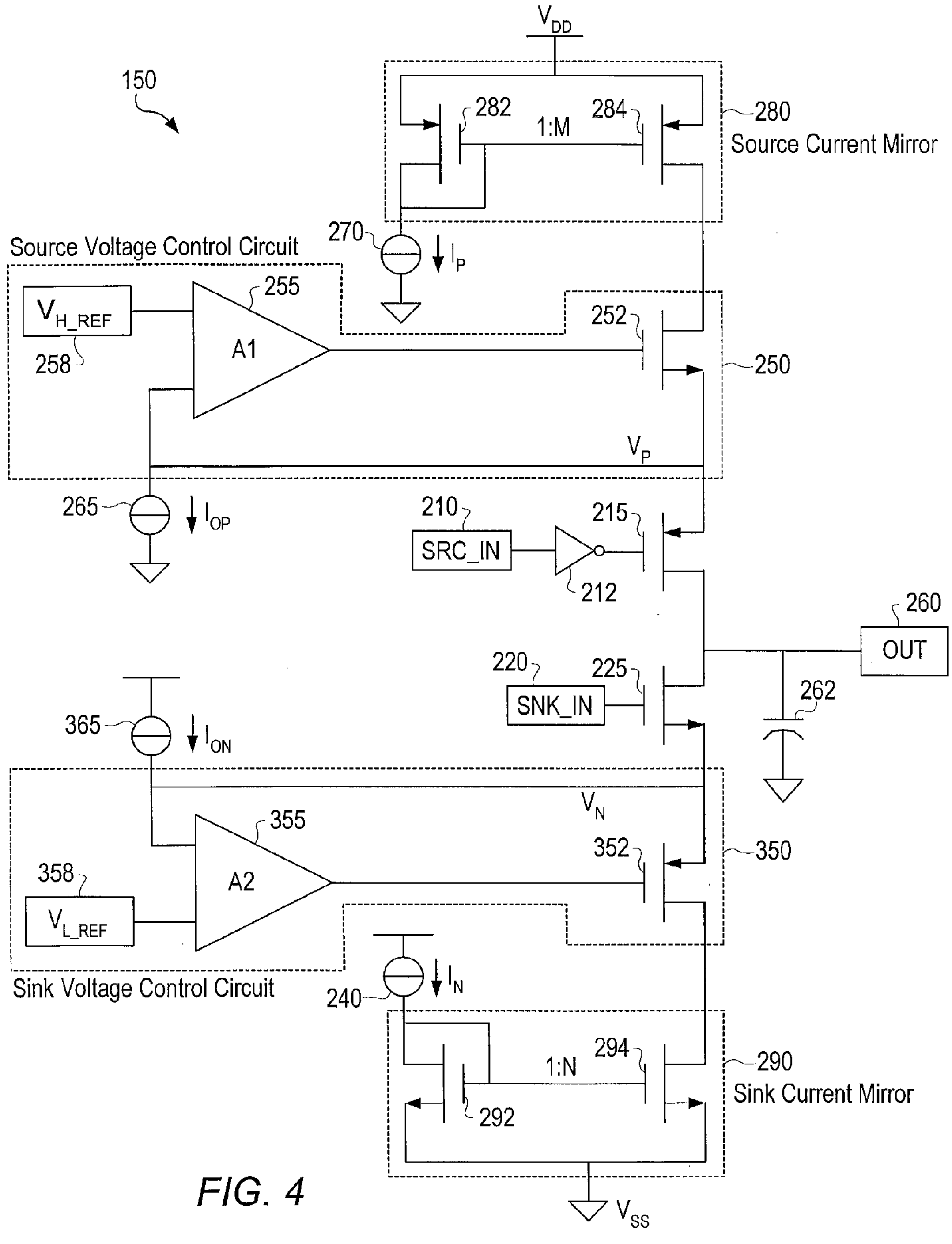
FIG. 4 is a circuit diagram of another embodiment of a driver circuit.

FIG. 4 is a circuit diagram of another embodiment of driver circuit 150. In one specific implementation, driver circuit 150 is formed as illustrated in the embodiment of FIG. 4. In this specific implementation, driver circuit 150 has a similar functionality and includes similar components as the embodiment of FIG. 3. In this implementation, besides the source voltage control circuit 250, driver circuit 150 includes a sink voltage control circuit 350 and the corresponding bias current source 365. Voltage control circuit 250 may include amplifier 255, reference voltage source 258 ($V_{H\_REF}$), and NMOS transistor 252. Voltage control circuit 350 may include an amplifier 355, a reference voltage source 358 ($V_{L\_REF}$), and a PMOS transistor 352 connected between sink current mirror 290, NMOS transistor 225, and bias current source 365, e.g., as illustrated in the embodiment of FIG. 4.

Figure 5:
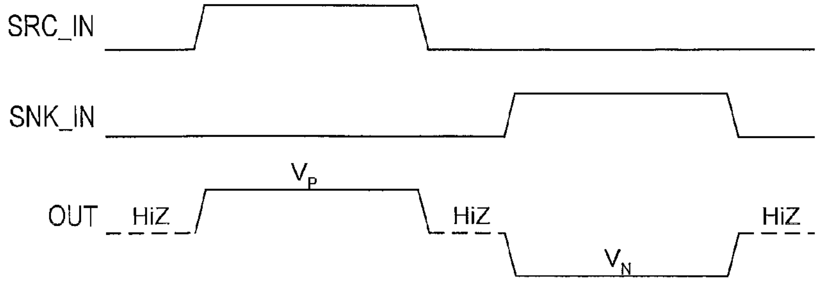
FIG. 5 is a timing diagram illustrating the driver circuit driving the output to either a source voltage or a sink voltage depending on the asserted control signal.

Similar to the embodiment of FIG. 3 described above, during operation, driver control unit 140 (or other control mechanisms) may provide a source control signal and a sink control signal to driver circuit 150 of FIG. 4. As shown in the timing diagram of FIG. 5, when the source control signal is asserted, driver circuit 150 may enter a source mode of operation, which drives output terminal 260 (and therefore communication medium 155) to a high state, e.g., to a desired source voltage $V_P$. When the sink control signal is asserted, driver circuit 150 may enter a sink mode of operation, which drives output terminal 260 to a low state, e.g., to a desired sink voltage $V_N$. When both the source control and sink control signals are deasserted, transistor 215 and transistor 225 are turned off and driver circuit 150 may enter a tristate mode or high impedance mode (i.e., HiZ). It is noted, however, that in other embodiments (with reference to both FIGS. 3 and 4) driver circuit 150 may be designed such that it enters a particular mode of operation when a control signal is deasserted. It is noted that similar variations may be implemented to control the modes of operation of driver circuit 150.

As depicted in the embodiment of FIG. 4, sink voltage control circuit 350 may implement a control loop to drive the drain terminal of NMOS transistor 225 to the desired sink voltage $V_N$. Sink input terminal 220 may receive the sink control signal. If the received sink control signal is asserted, NMOS transistor 225 is turned on and driver circuit 150 enters a sink mode of operation. More specifically, in response to turning on NMOS transistor 225, voltage control circuit 350 may drive output terminal 260 of driver circuit 150 to the desired sink voltage $V_N$. Additionally, sink current mirror 290 may regulate a sink current provided to output terminal 260 when NMOS transistor 225 is turned on.

It should be noted that the components described with reference to FIG. 4 are meant to be exemplary only, and are not intended to limit the invention to any specific set of components or configurations. For example, in various embodiments, one or more of the components described may be omitted, combined, modified, or additional components included, as desired.

It is noted that in other embodiments of driver circuit 150 (with reference to both FIGS. 3 and 4), the transistors in various parts of the circuitry may either be PMOS or NMOS transistors depending on the particular design. For instance, in the embodiment of FIG. 4, transistor 215 may be a PMOS transistor (which is connected to inverter 212), whereas in the embodiment of FIG. 3, transistor 215 is an NMOS transistor. In various embodiments, the optimal choice of using either a PMOS or NMOS transistor may depend on the values of $V_{DD}$, $V_N$ and $V_P$.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A driver circuit comprising:

an output terminal;

a source input terminal configured to couple to a first switch and configured to receive a source control signal;

a voltage control circuit configured to drive one of the terminals of the first switch to a source voltage;

wherein, in response to receiving an asserted source control signal, the first switch is turned on and the voltage control circuit is operable to drive the output terminal of the driver circuit to the source voltage;

a source current mirror coupled to the first switch and configured to regulate a source current provided to the output terminal of the driver circuit when the first switch is turned on;

a sink input terminal configured to couple to a second switch and configured to receive a sink control signal, wherein, in response to receiving an asserted sink control signal, the second switch is turned on and the output terminal of the driver circuit is driven to a sink voltage; and a sink current mirror coupled to the second switch and configured to regulate a sink current provided to output terminal of the driver circuit when the second switch is turned on.

2. The driver circuit of claim 1, wherein the source current mirror is coupled between the first switch and a source current source, and wherein the sink current mirror is coupled between the output terminal of the driver circuit and the second switch, wherein the second switch is also coupled to a sink current source.

3. The driver circuit of claim 1, wherein the voltage control circuit includes an amplifier, wherein a first input terminal of the amplifier is coupled to a reference voltage source and a second input terminal of the amplifier is coupled to one of the terminals of the first switch.

4. The driver circuit of claim 3, wherein an output terminal of the amplifier is coupled to a gate terminal of a transistor, wherein the drain terminal of the transistor is coupled to the source current mirror, and the source terminal of the transistor is coupled to the first switch and the second input terminal of the amplifier, wherein the amplifier is operable to drive the transistor and maintain the source voltage at a voltage value associated with the reference voltage source.

5. The driver circuit of claim 1, wherein, in response to receiving both a deasserted source control signal and a deasserted sink control signal, the first switch and the second switch are turned off and the driver circuit is configured to enter a tristate mode of operation.

6. The driver circuit of claim 1, wherein, in response to receiving an asserted source control signal, the driver circuit is configured to enter a source mode of operation, wherein during the source mode of operation the driver circuit is operable to drive the output terminal to a high state.

7. The driver circuit of claim 1, wherein, in response to receiving an asserted sink control signal, the driver circuit is configured to enter a sink mode of operation, wherein during the sink mode of operation the driver circuit is operable to drive the output terminal to a low state.

8. The driver circuit of claim 1, wherein the source control signal and the sink control signal are independent control signals used for controlling the mode of operation of the driver circuit.

9. The driver circuit of claim 1, wherein the source current mirror and the sink current mirror are operable to independently control the source current and the sink current, respectively, provided to the output terminal of the driver circuit.

10. The driver circuit of claim 1, wherein the source voltage is lower than a voltage value associated with a supply voltage of the driver circuit.

11. The driver circuit of claim 1, further comprising a second voltage control circuit configured to drive one of the terminals of the second switch to a sink voltage, wherein in response to receiving an asserted sink control signal, the second switch is turned on and the second voltage control circuit is operable to drive the output terminal of the driver circuit to the sink voltage.

12. The driver circuit of claim 1, wherein the first switch and the second switch are configured as transistors.

13. A driver circuit comprising:

a first transistor;

a second transistor;

an output terminal;

a source input terminal coupled to the gate terminal of the first transistor, wherein the source terminal of the first transistor is coupled to the output terminal of the driver circuit;

a voltage control circuit coupled to the drain terminal of the first transistor, wherein the voltage control circuit is configured to drive the drain terminal of the first transistor to a source voltage;

a source current mirror coupled between the drain terminal of the first transistor and a source current source;

a sink input terminal coupled to the gate terminal of the second transistor, wherein the drain terminal of the second transistor is coupled to a sink current source; and a sink current mirror coupled between the output terminal of the driver circuit and the source terminal of the second transistor.

14. The driver circuit of claim 13, wherein the voltage control circuit includes an amplifier, wherein a first input terminal of the amplifier is coupled to a reference voltage source and a second input terminal of the amplifier is coupled to the drain terminals of the first transistor.

15. The driver circuit of claim 14, wherein an output terminal of the amplifier is coupled to a gate terminal of a third transistor, wherein the drain terminal of the third transistor is coupled to the source current mirror, and the source terminal of the third transistor is coupled to the drain terminal of the first transistor and the second input terminal of the amplifier.

16. The driver circuit of claim 13, wherein the source input terminal is configured to receive a source control signal, wherein, in response to receiving an asserted source control signal, the first transistor is turned on and the voltage control circuit is operable to drive the output terminal of the driver circuit to the source voltage.

17. The driver circuit of claim 16, wherein the source current mirror is configured to regulate a source current provided to output terminal of the driver circuit when the first transistor is turned on.

18. The driver circuit of claim 13, wherein the sink input terminal is configured to receive a sink control signal, wherein, in response to receiving an asserted sink control signal, the second transistor is turned on and the output terminal of the driver circuit is driven to a sink voltage.

19. The driver circuit of claim 18, wherein the sink current mirror is configured to regulate a sink current provided to output terminal of the driver circuit when the second transistor is turned on.

20. A system comprising:

a driver control unit configured to generate a source control signal and a sink control signal; and a driver circuit including:

an output terminal;

a source input terminal configured to couple to a first switch and configured to receive the source control signal;

a voltage control circuit configured to drive one of the terminals of the first switch to a source voltage;

wherein, in response to receiving an asserted source control signal, the first switch is turned on and the voltage control circuit is operable to drive the output terminal of the driver circuit to the source voltage;

a source current mirror coupled to the first switch and configured to regulate a source current provided to the output terminal of the driver circuit when the first switch is turned on;

a sink input terminal configured to couple to a second switch and configured to receive the sink control signal, wherein, in response to receiving an asserted sink control signal, the second switch is turned on and the output terminal of the driver circuit is driven to a sink voltage; and a sink current mirror coupled to the second switch and configured to regulate a sink current provided to output terminal of the driver circuit when the second switch is turned on.

21. The system of claim 20, coupled to a target device via a communication medium, wherein the driver circuit of the system is configured to drive the communication medium with either the source voltage or the sink voltage to communicate with the target device.

* * * * *